United States Patent
Hayase et al.

(10) Patent No.: US 9,953,902 B2
(45) Date of Patent: Apr. 24, 2018

(54) SEMICONDUCTOR DEVICE INCLUDING SEMICONDUCTOR CHIPS ELECTRICALLY CONNECTED VIA A METAL PLATE

(71) Applicant: KABUSHIKI KAISHA TOSHIBA, Tokyo (JP)

(72) Inventors: Shigeaki Hayase, Kanazawa Ishikawa (JP); Hiroshi Matsuyama, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/250,851

(22) Filed: Aug. 29, 2016

(65) Prior Publication Data

US 2017/0271247 A1 Sep. 21, 2017

(30) Foreign Application Priority Data

Mar. 15, 2016 (JP) ................................. 2016-051682

(51) Int. Cl.
| | |
|---|---|
| *H01L 23/495* | (2006.01) |
| *H01L 23/492* | (2006.01) |
| *H01L 23/535* | (2006.01) |
| *H01L 27/06* | (2006.01) |

(52) U.S. Cl.
CPC ...... *H01L 23/49562* (2013.01); *H01L 23/492* (2013.01); *H01L 23/4952* (2013.01); *H01L 23/535* (2013.01); *H01L 27/0629* (2013.01)

(58) Field of Classification Search
CPC ............. H01L 23/49562; H01L 23/492; H01L 23/495; H01L 23/4952; H01L 23/535; H01L 27/0629
See application file for complete search history.

(56) References Cited

U.S. PATENT DOCUMENTS

| | | | |
|---|---|---|---|
| 2006/0194457 A1 | 8/2006 | Okazaki et al. | |
| 2010/0244213 A1* | 9/2010 | Nozaki | H01L 23/49524 |
| | | | 257/676 |
| 2014/0185256 A1 | 7/2014 | Ogawa et al. | |

FOREIGN PATENT DOCUMENTS

| | | |
|---|---|---|
| JP | 2546522 B2 | 10/1996 |
| JP | 2006237507 A | 9/2006 |
| WO | 2013035715 A1 | 3/2013 |

* cited by examiner

*Primary Examiner* — Tucker J Wright
(74) *Attorney, Agent, or Firm* — Patterson & Sheridan, LLP

(57) ABSTRACT

A semiconductor device includes first and second conductive layers on a substrate and separated from each other. A first semiconductor chip is mounted on the first conductive layer and has a first electrode on a side opposite the first conductive layer. A second semiconductor chip is mounted on the first conductive layer and has a second electrode on a side opposite the first conductive layer. A first metal member is mounted on the first electrode. A second metal member is mounted on the second electrode. A metal plate has a first portion disposed on the first and second metal members, and a second portion connected to the second conductive layer. The metal plate electrically connects the first and second electrodes to the second conductive layer through the first and second metal members.

17 Claims, 9 Drawing Sheets

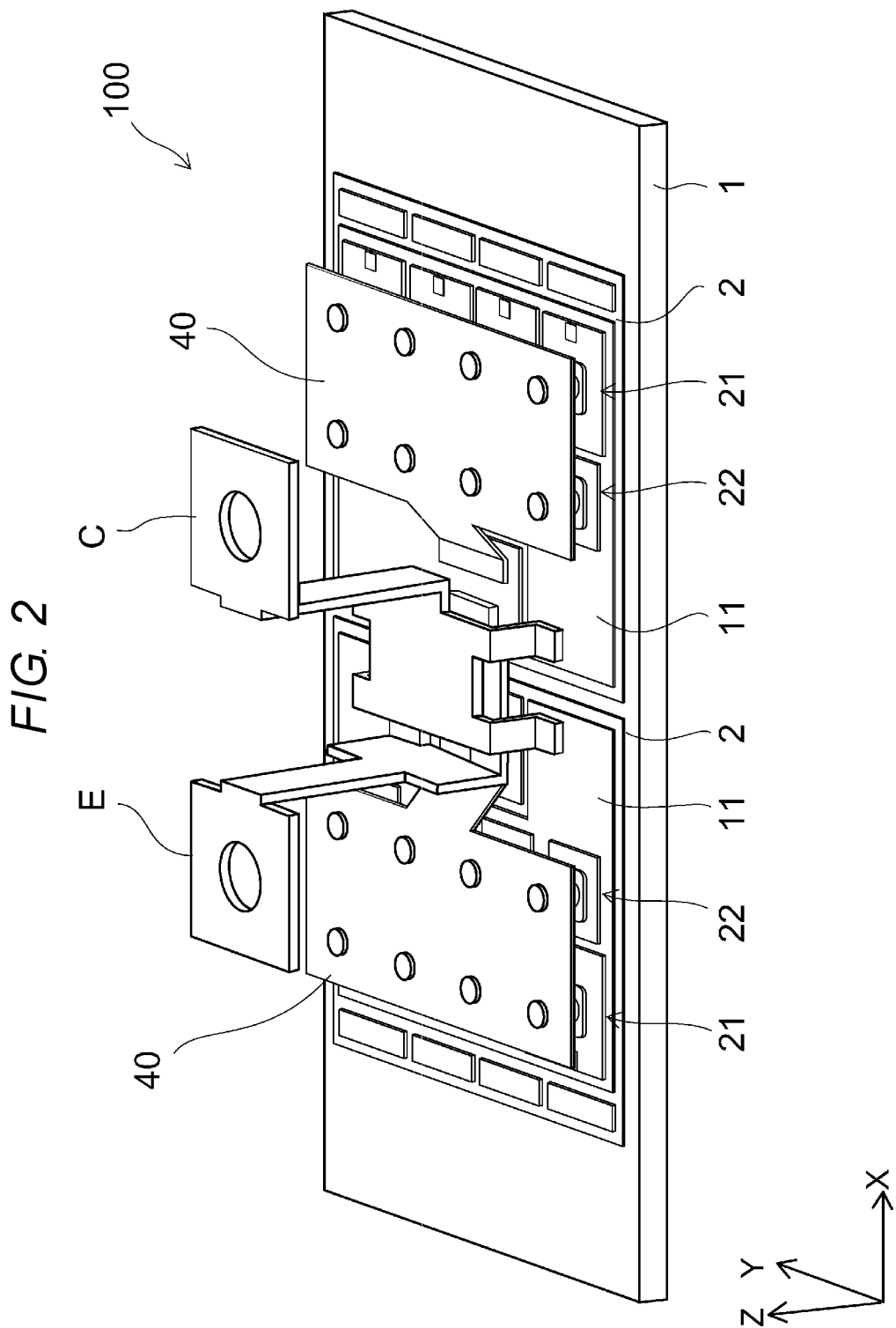

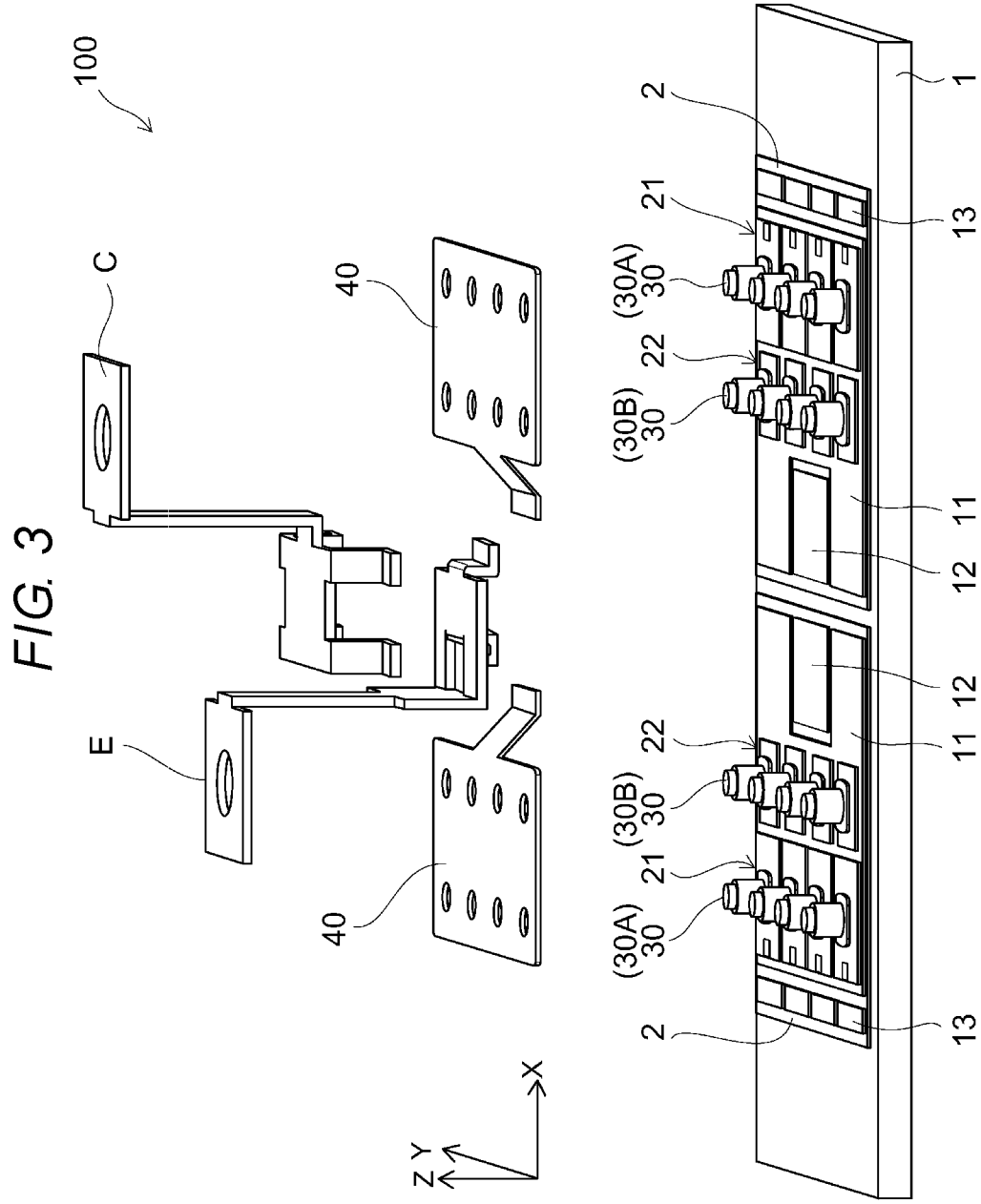

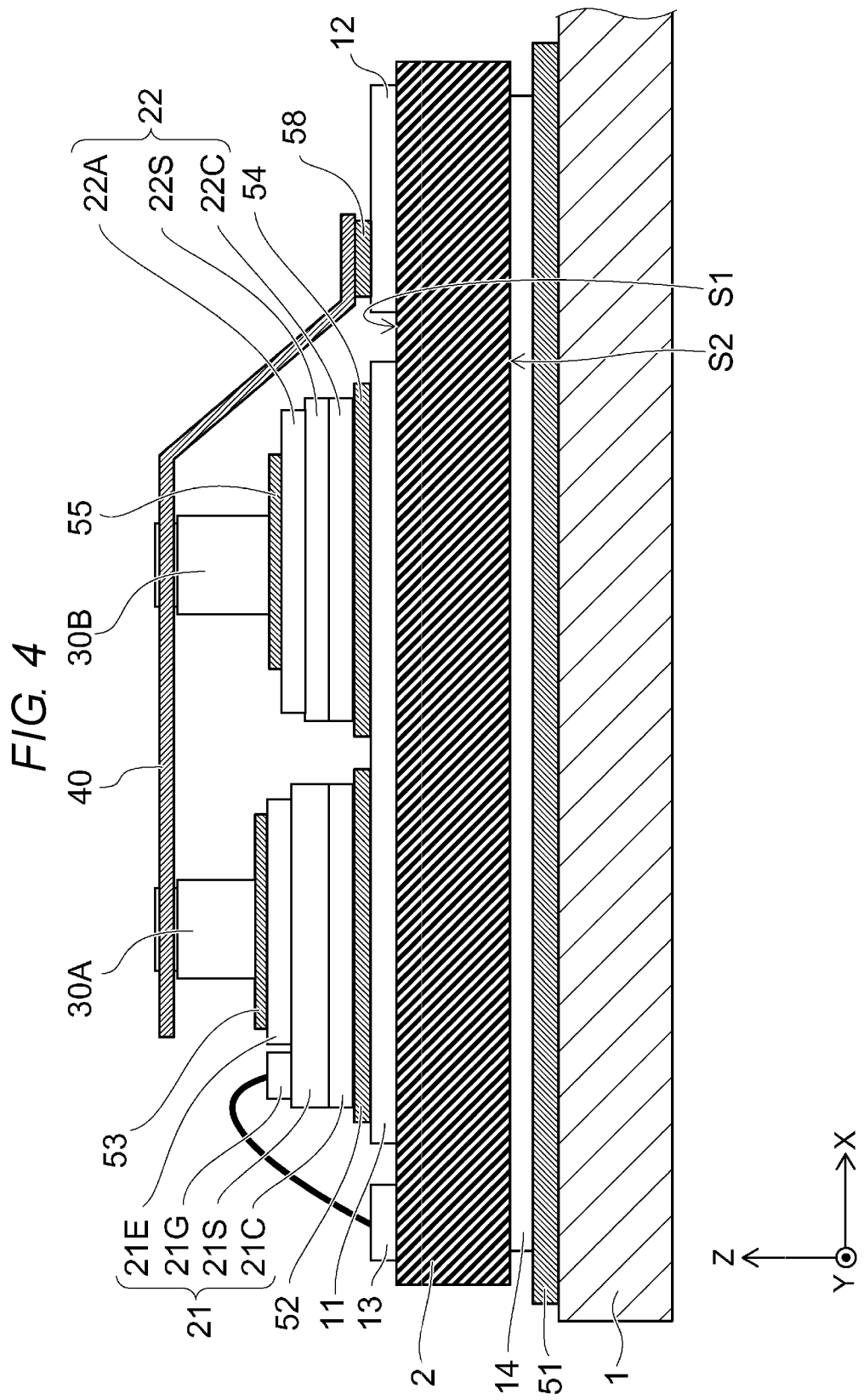

SEMICONDUCTOR DEVICE INCLUDING SEMICONDUCTOR CHIPS ELECTRICALLY CONNECTED VIA A METAL PLATE

CROSS-REFERENCE TO RELATED APPLICATION

This application is based upon and claims the benefit of priority from Japanese Patent Application No. 2016-051682, filed Mar. 15, 2016, the entire contents of which are incorporated herein by reference.

FIELD

Embodiments described herein relate generally to a semiconductor device.

BACKGROUND

There is provided a semiconductor device having a plurality of semiconductor chips, such as a diode or an insulated gate bipolar transistor (IGBT). Such a semiconductor device can provide high reliability.

DESCRIPTION OF THE DRAWINGS

FIG. 2 is a perspective view illustrating internal aspects of the semiconductor device according to the first embodiment.

FIG. 3 is an exploded view illustrating aspects the semiconductor device according to the first embodiment.

FIG. 4 is a cross-sectional view illustrating a portion of the semiconductor device according to the first embodiment.

DETAILED DESCRIPTION

Figure 1:
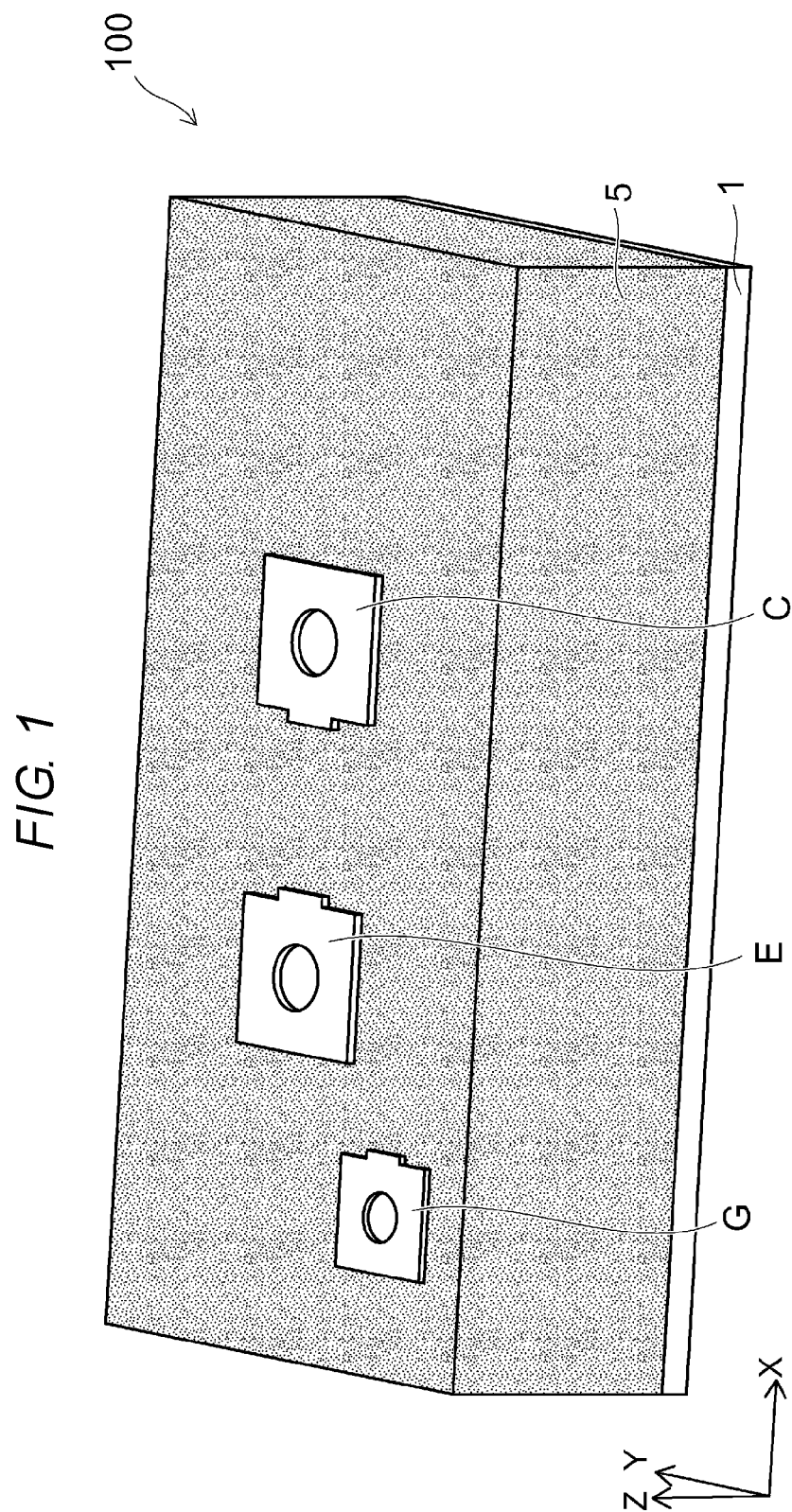
FIG. 1 is a perspective view illustrating external aspects of a semiconductor device according to a first embodiment.

In general, according to one embodiment, a semiconductor device includes first conductive layer on a substrate, and a second conductive layer on the substrate, separated from the first conductive layer. A first semiconductor chip is mounted on the first conductive layer and has a first electrode on a side opposite the first conductive layer. A second semiconductor chip is mounted on the first conductive layer and has a second electrode on a side opposite the first conductive layer. A first metal member is mounted on the first electrode and extends away from the first semiconductor chip. A second metal member is mounted on the second electrode and extends away from the second semiconductor chip. A metal plate has a first portion disposed on the first and second metal members and a second portion connected to the second conductive layer. The metal plate electrically connects the first and second electrodes to the second conductive layer through the first and second metal members.

Hereinafter, example embodiments will be described with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures. In the disclosure, components similar to those described previously with reference to earlier figures are labeled with like reference numerals, and the detailed description thereof may be omitted appropriately.

In the description of embodiments, an XYZ orthogonal coordinate system is used for convenience. A direction perpendicular to a top surface S1 of a substrate 2 as shown in FIG. 4 is defined as a Z direction (first direction) and two directions perpendicular to the Z direction, which are orthogonal to each other are defined as X and Y directions.

An example of the semiconductor device according to a first embodiment will be described with referent to FIGS. 1 to 4.

FIGS. 1 to 3 are perspective views of a semiconductor device 100 according to the first embodiment.

In FIGS. 2 and 3, a sealing portion 5, a gate terminal G, and a portion of wiring are omitted.

In addition, in FIG. 3, a metal plate 40, an emitter terminal E, and a collector terminal C are shown so as to be separated from the other constituent elements.

FIG. 4 is a cross-sectional view illustrating a portion of the semiconductor device 100 according to the first embodiment.

In particular, FIG. 4 illustrates a portion of a structure on the X-Z cross section passing through a first conductive layer 11 to a third conductive layer 13, semiconductor chips 21 and 22, and metal members 30A and 30B.

As shown in FIGS. 1 to 4, the semiconductor device 100 includes a substrate 1, the substrate 2, the sealing portion 5, the first conductive layer 11, the second conductive layer 12, the third conductive layer 13, a fourth conductive layer 14, the semiconductor chip 21, the semiconductor chip 22, the metal member 30, the metal plate 40, connectors 51 to 55 and 58, the collector terminal C, the emitter terminal E, and the gate terminal G. The semiconductor chip 21 includes, for example, an IGBT. The semiconductor chip 22 includes, for example, a fast recovery diode (FRD).

As shown in FIG. 1, the sealing portion 5 is provided on the first substrate 1 so as to seal other constituent elements provided on the first substrate 1. A portion of the emitter terminal E, a portion of the collector terminal C, and a portion of the gate terminal G are provided on the sealing portion 5 and exposed to the outside. The tip end of each of the terminals has a hole and is connectable to an external circuit.

As shown in FIGS. 2 and 3, a plurality of substrates 2 are provided inside the sealing portion 5 and on the substrate 1, with each substrate 2 being separated from the other.

As shown in FIG. 4, the fourth conductive layer 14 is provided on a bottom surface S2 of the substrate 2. The fourth conductive layer 14 is connected to the top surface of the substrate 1 by the connector 51, thus fixing the substrate 2 on the substrate 1.

In addition, the first conductive layer 11, the second conductive layer 12, and the plurality of third conductive layers 13 are provided on the top surface S1 (first surface) of the substrate 2 so as to be separated from each other (see also FIG. 3).

As shown in FIGS. 2 and 3, the first conductive layer 11 is connected to the collector terminal C. The second conductive layer 12 is connected to the emitter terminal E. The third conductive layer 13 is connected the gate terminal G through a wiring (not specifically shown) and a printed circuit board or the like.

The arrangements, the shapes, or the like of the first conductive layer 11, the second conductive layer 12, and the third conductive layer 13 can vary appropriately according to the arrangements or the shapes of the each terminals and the arrangements or the number of the semiconductor chips 21 and 22 to be described.

As shown in FIG. 2, a plurality of the semiconductor chips 21 and a plurality of the semiconductor chips 22 are provided on the first conductive layer 11.

As shown in FIG. 4, the semiconductor chip 21 is provided on the first conductive layer 11, connected to the first conductive layer 11 by the connector 52.

The semiconductor chip 21 includes a semiconductor layer 21S, a collector electrode 21C, an emitter electrode 21E, and a gate electrode 21G. The collector electrode 21C is connected to the first conductive layer 11 through the connector 52. A structure required for causing the semiconductor chip 21 to function as an IGBT is formed in the semiconductor layer 21S. The gate electrode 21G is connected the third conductive layer 13 with a bonding wire.

The semiconductor chip 22 is provided on the first conductive layer 11, connected to the first conductive layer 11 by the connector 54. The semiconductor chip 22 includes a semiconductor layer 22S, a cathode electrode 22C, and an anode electrode 22A. The cathode electrode 22C is connected to the first conductive layer 11 by the connector 54. A structure required for causing the semiconductor chip 22 to function as a diode is formed in the semiconductor layer 22S.

A metal member 30A is provided on the emitter electrode 21E through the connector 53. A metal member 30B is provided on the anode electrode 22A through a connector 55. Hereinafter, when common properties between the metal member 30A and the metal member 30B are described, metal member 30A and metal member 30B may be collectively called "metal member 30".

A portion of the metal plate 40 is provided on a plurality of metal members 30, and the other is provided on the second conductive layer 12, connected to the second conductive layer 12 by a connector 58. That is, the emitter electrode 21E is connected to the second conductive layer 12 by the metal member 30A and the metal plate 40. The anode electrode 22A is connected to the second conductive layer 12 by the metal member 30B and the metal plate 40.

Figure 5A:
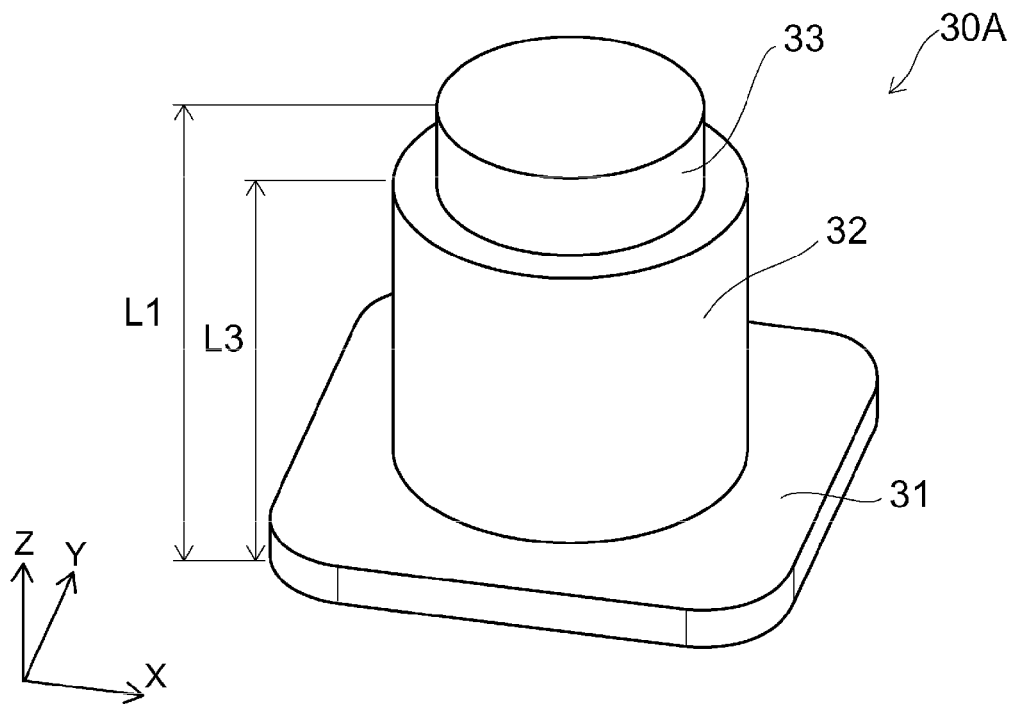
FIGS. 5A and 5B are perspective views of metal members included in the semiconductor device according to the first embodiment.
Figure 5B:
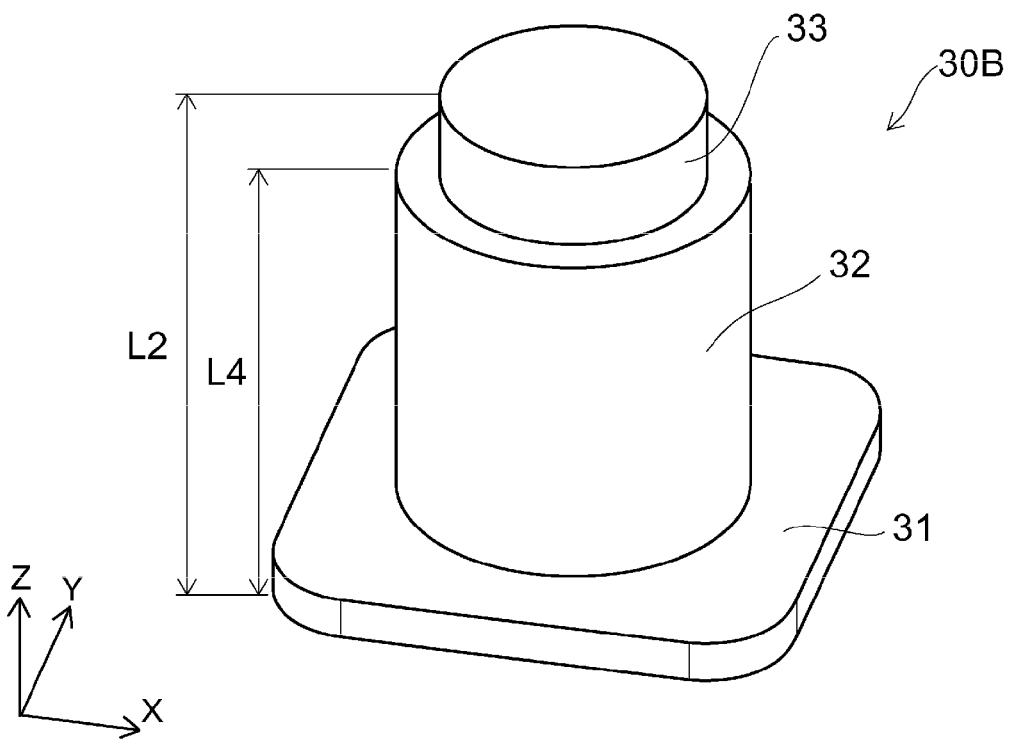
Figure 6A:
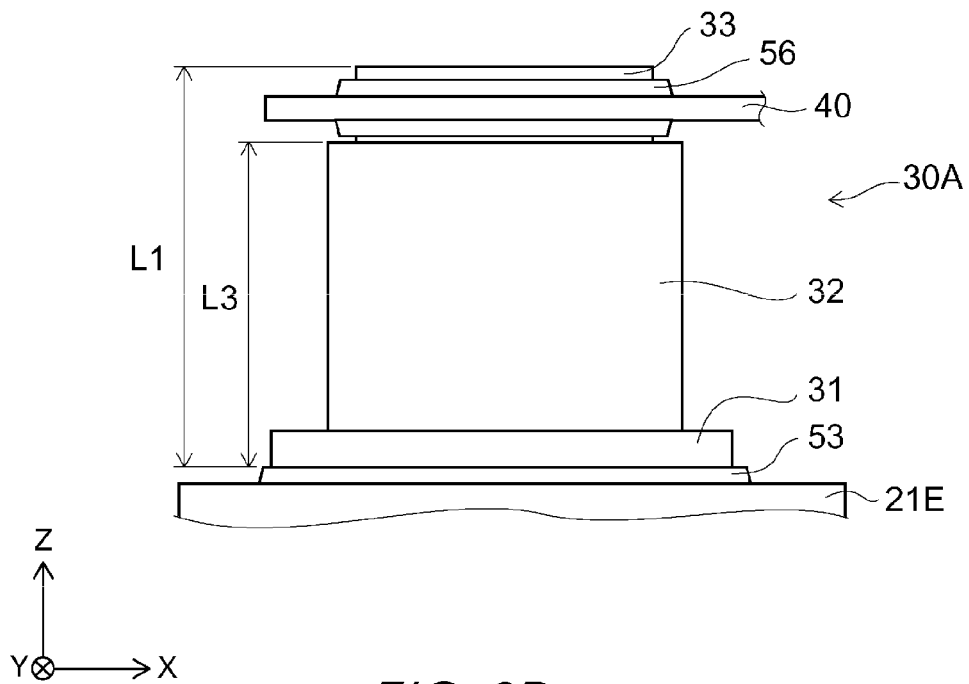
FIGS. 6A and 6B are side views illustrating a portion of the metal members and metal plates included in the semiconductor device according to the first embodiment.
Figure 6B:
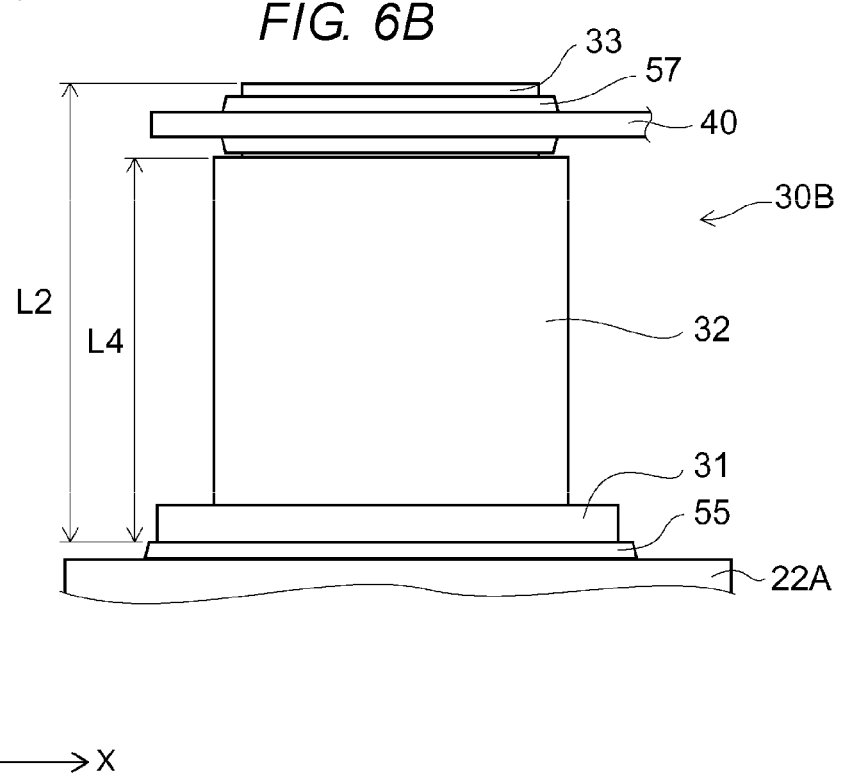

FIGS. 5A and 5B are perspective views of the metal member 30 included in the semiconductor device 100 according to the first embodiment. FIGS. 6A and 6B are side views illustrating a portion of the metal member 30 and the metal plate 40 included in the semiconductor device 100 according to the first embodiment. FIGS. 5A and 6A illustrate the metal member 30A and FIGS. 5B and 6B illustrate the metal member 30B.

As shown in FIGS. 5A to 6B, the metal member 30 includes a bottom portion 31, a main body portion 32, and a projection portion 33. The bottom portion 31 is positioned under the main body portion 32 of metal member 30. In the X-Y plane, the area of the bottom portion 31 is greater than the area of the main body portion 32 and greater than the area of the projection portion 33. When the metal member 30 is provided on each electrode, the bottom portion 31 is connected to each electrode 21E and 22A by the connector 53 and 54 respectively. The main body portion 32 is provided on the bottom portion 31. The projection portion 33 is provided on and above the main body portion 32. A width of the projection portion 33 (dimension in the X direction and the Y direction) is less than the width of the main body portion 32.

A length L1 of the metal member 30A in the Z direction is shorter than a length L2 of the metal member 30B in the Z direction. The length of the projection portion 33 of the metal member 30A in the Z direction is identical to the length of the projection portion 33 of the metal member 30B in the Z direction. A length L3 of the bottom portion 31 and the main body portion 32 of the metal member 30A in the Z direction is shorter than a length L4 of the bottom portion 31 and the main body portion 32 of the metal member 30B in the Z direction.

As shown in FIGS. 2 and 3, the metal plate 40 has a plurality of holes. As shown in FIGS. 6A and 6B, the projection portion 33 of each metal member 30 is inserted into each hole of the metal plate 40. In addition, the connector 56 is provided in a gap between the metal member 30A and the hole of the metal plate 40, and the connector 57 is provided in a gap between the metal member 30B and the hole of the metal plate 40. The metal member 30 is connected to the metal plate 40 by the connectors 56 and 57.

Here, an example of a material of each constituent element according to one embodiment will be described. The substrate 1 includes a heat sink formed of AlSiC (aluminum silicon carbide) or the like. The substrate 2 is comprised of an insulating ceramic material such as AlN (aluminum nitride). The sealing portion 5 is comprised of an insulating resin such as a silicone resin. The first conductive layer 11, the second conductive layer 12, the third conductive layer 13, and the fourth conductive layer 14 are each comprised of a metal material such as copper or aluminum.

The semiconductor layers 21S and 22S are each comprised of a semiconductor material such as silicon, silicon carbide, gallium nitride, or gallium arsenide as a main component. Each electrode included in the semiconductor chips 21 and 22 is comprised of a metal material such as aluminum or nickel. The metal member 30, the metal plate 40, the emitter terminal E, the collector terminal C, and the gate terminal G are formed of a metal material such as copper or aluminum. The connectors 51 to 59 contain a metal material such as solder, copper, or silver.

Here, the operation of effect of the present embodiment will be described. In the semiconductor device 100 according to the present embodiment, a plurality of semiconductor chips 21 is provided on the substrate 2. The metal member 30A is provided on each semiconductor chip 21 through the connector 53.

When a connector 53 (e.g., solder) is arranged on each of the semiconductor chips 21, a variation in the thickness of the connector 53 may occur. That is, for example, the solder layers (or solder balls) used in forming each individual connector 53 may vary in amount on the different semiconductor chips 21. Accordingly, if the metal plate 40 were to be disposed on the semiconductor chips 21 by direct soldering (i.e., just connector 53 between chip surface and metal plate 40), the metal plate 40 might be inclined or tilted due to the variation in the thicknesses of the solder (which ultimately forms the connectors 53) on the semiconductor chips 21. If the metal plate 40 is inclined, the thickness of some the resulting connectors 53 could be reduced from the intended thickness value. It may also be the case that the forces caused by a tilted metal plate 40 might cause some portion of a connector 53 to be thinner than the other portions of the connector 53. In a connector 53 having a thickness that is too thin, cracking or the like may occur as a result of repetition on thermal expansion and thermal shrinkage (thermal cycling events) attendant with the use of the semiconductor device. Therefore, the semiconductor device having this construction (direct soldering of plate to chip) may eventually fail and reliability would be reduced.

However, in the semiconductor device according to the present embodiment, the connector 53 is provided on each of the semiconductor chips 21 and the metal member 30A is provided on each of the connectors 53. In this case, since these metal members 30A are separately provided on each of the connectors 53, the metal member 30A will not be caused to be tilted/inclined by the differences in thickness of the different connectors 53 (or the amounts of solder used in forming these connectors 53). Therefore, it is possible to suppress a decrease in the thickness of the connector 53 that might result from the application of a tilted metal plate 40 directly to the solder forming the connector 53 on each semiconductor chip 21.

On the other hand, a variation in the position of each metal member 30A in the Z direction might occurs due to the variations in the thickness of the different connectors 53. Therefore, the metal plate 40 provided on the metal member 30A might also still be inclined in some manner. As such, there would still be a possibility that the thickness of a portion of the connector 56 (see FIG. 6A) would be decreased as result.

However, the distance between the connector 56 and the semiconductor chip 21 is greater than the distance between the connector 53 and the semiconductor chip 21. In addition, since the metal member 30A is formed of a metal, a portion of the heat generated in the semiconductor chip 21 will be released by the metal member 30A, and thus is not transmitted to the connector 56. Therefore, a temperature change rate for the connector 56 during operation of the semiconductor device will be generally lower than the temperature change rate for the connector 53. Thus, even when the thickness of a portion of the connector 56 is decreased, the cracking in the connector 56 is less likely to occur.

Here, the variation in the thickness between the connectors 53 provided on each of the semiconductor chips 21 will be described. However, the present embodiment is not limited thereto. And the description is similarly applicable to the connectors 55 that are provided on each of the semiconductor chips 22 and the variation in the thickness between the connectors 55 provided on the semiconductor chips 22.

That is, according to the present embodiment, the metal members 30A and 30B are separately provided on each of the plurality of semiconductor chips 21 and 22, and the metal plate 40 is provided on the metal members 30A and 30 B. Accordingly, the occurrence of the crack or the like in the connectors 53 and 55 which might otherwise be caused by the metal plate 40 being inclined will be suppressed. Therefore, it is possible to improve the reliability of the semiconductor devices incorporating this embodiment.

In addition, in the semiconductor device according to the first embodiment, the thickness of the semiconductor chip 21 is larger than the thickness of the semiconductor chip 22. The reason thereof is that when the same breakdown resistance is required with respect to a FRD and an IGBT, the thickness of the IGBT will generally have to be greater than that of the FRD.

Therefore, when the metal plate 40 is to be directly provided on the semiconductor chips 21 and 22, the metal plate 40 can also be inclined due to a difference in the thicknesses of the semiconductor chips 21 and 22. Accordingly, a thickness of some of the connectors (solder) between the plate and the chip can be become decreased in a manner similar to that described above.

In the semiconductor device according to the present embodiment, the length L2 of the metal member 30B provided on the semiconductor chip 22, in the Z direction is set to be longer than the length L1 of the metal member 30A provided on the semiconductor chip 21, in the Z direction. When the length L2 of the metal member 30B is longer than the length L1 of the metal member 30A, at least a portion of the difference in the thicknesses of the semiconductor chips 21 and 22 can offset by the difference in lengths of the metal members 30A and 30B. Therefore, by varying the lengths between the metal members 30A and 30B, a degree of incline of the metal plate 40 due to the difference in thickness between the semiconductor chips 21 and 22 is reduced, thus decreasing the possibility that the thickness of the connector becomes decreased.

That is, according to the present embodiment, the metal plate 40 is provided on the metal members 30A and 30B which can have different respective lengths. Accordingly, the occurrence of cracking or like in each connector can be suppressed. Therefore, it is possible to improve the reliability of the semiconductor device.

In FIGS. 5A to 6B, an example of a case where the length L2 of the metal member 30B is longer than the length L1 of the metal member 30A is shown. However, in another embodiment, the length L1 may be identical to the length L2. In such a case, the metal members 30A and 30B may have the same length or indeed, the length L2 can be less than the length L1. In this and other cases, the ratio of L1 to L3 and L2 to L4 may be varied accordingly to account for chip thickness differences. That is the length of projection portion 33 may be different for the metal members 30A and 30B. In addition, in the above-described semiconductor device 100, the metal members 30A and 30B and the metal plate 40 are each discrete element from each other, and these are connected to each other by soldering or the like. However, when the goal is to offset the difference between the thicknesses of the semiconductor chips 21 and 22 by means of using the differences in the length of the metal member 30A and the length of the metal member 30B, it is possible that the metal members 30A and 30B and the metal plate 40 may be a unitary on integrated member in which there are integrally formed prior to attachment to the semiconductor chips 21 and 22.

Modification Example

Figure 7A:
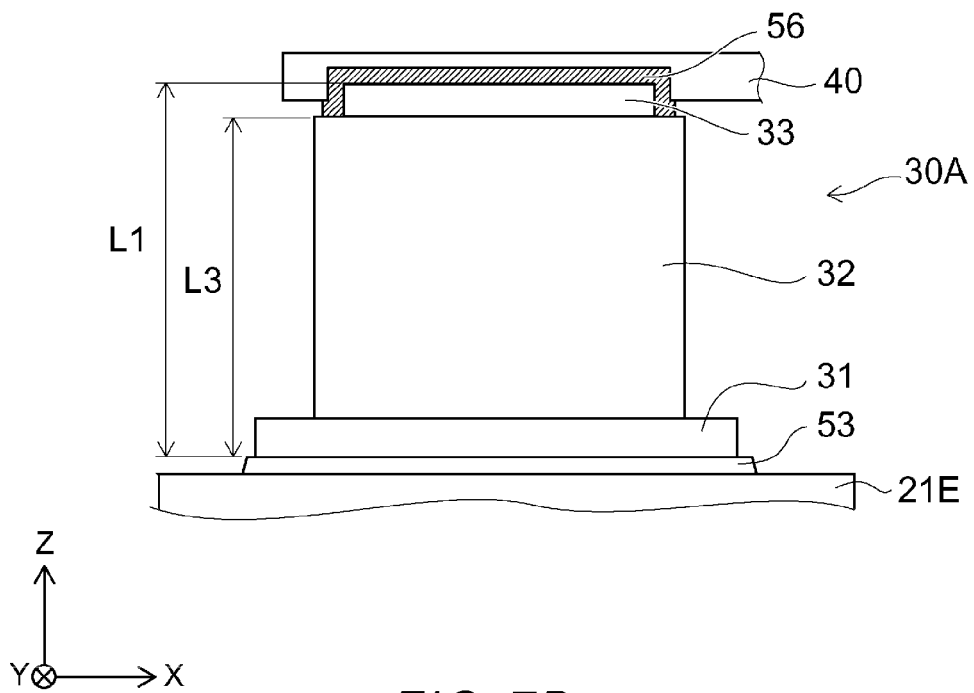
FIGS. 7A and 7B are cross-sectional views illustrating a portion of the metal members and the metal plates included in the semiconductor device according to a modification example of the first embodiment.
Figure 7B:
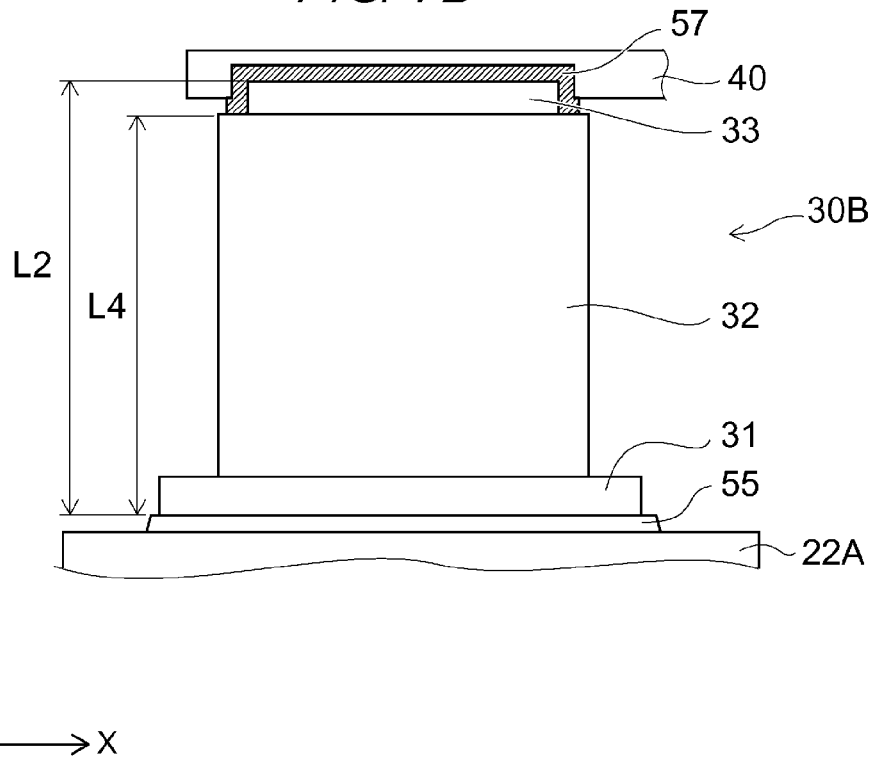

FIGS. 7A and 7B are cross-sectional views illustrating a portion of the metal members 30A and 30B and the metal plate included in the semiconductor device according to a modification example of the first embodiment.

In the examples shown in FIGS. 5A to 6B, the metal plate 40 has a plurality of holes and the projection portions 33 of the metal members 30A and 30B are eventually inserted into the holes of the metal plate 40.

By contrast, in the examples shown in FIGS. 7A and 7B, a plurality of recesses are provided on the bottom surface of the metal plate 40, and the projection portions 33 of the metal members 30A and 30B are inserted into the recesses. The connectors 56 and 57 are provided between inner wall of the recesses and the projection portions 33.

In this case, similar to the examples shown in FIGS. 5A to 6B, the length L2 of the metal member 30B is set to be longer than the length L1 of the metal member 30A, whereby the differences in the thickness between the semiconductor chips 21 and 22 can be offset.

Second Embodiment

Figure 8:
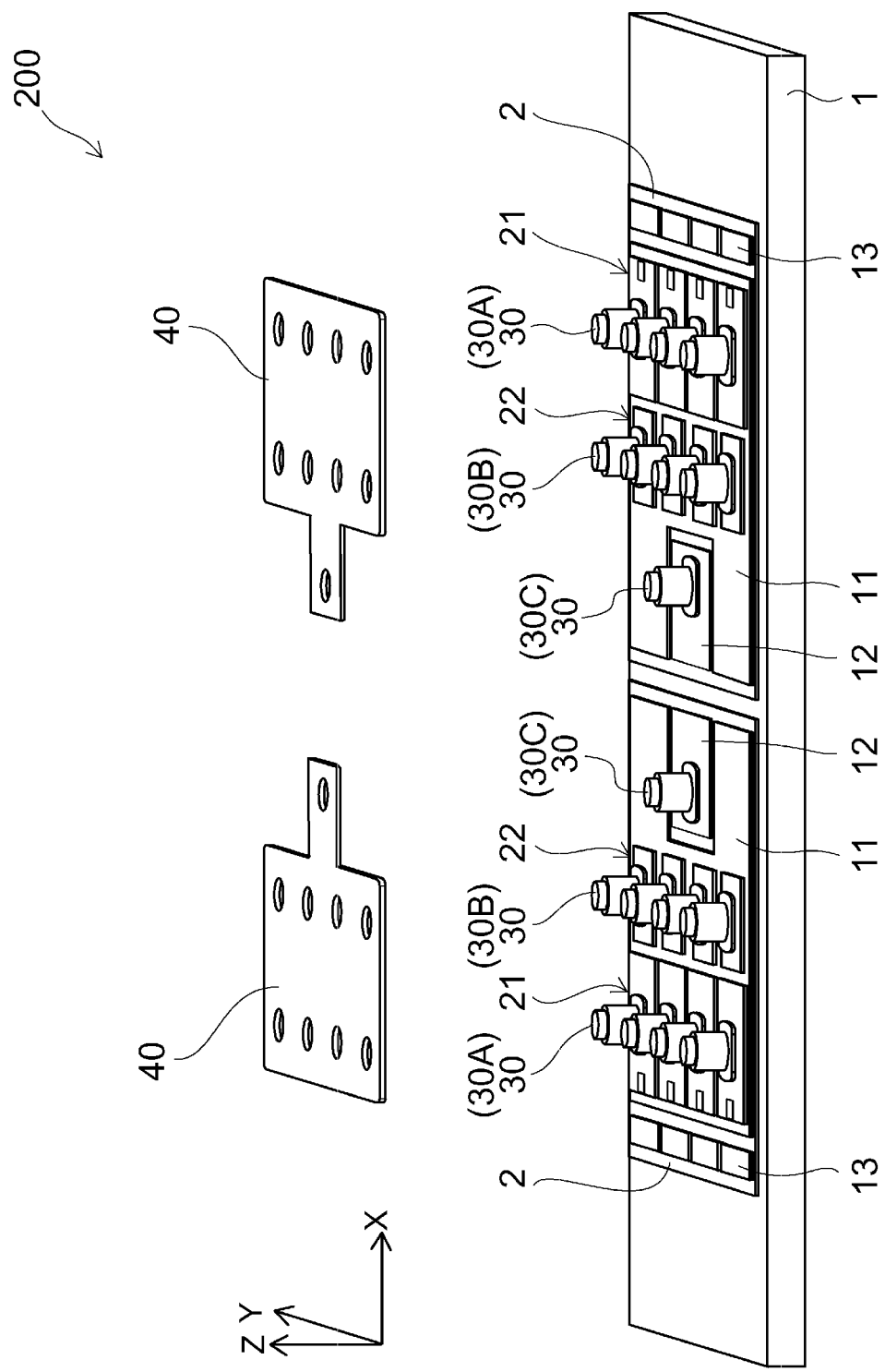
FIG. 8 is an exploded view illustrating aspects of a semiconductor device according to a second embodiment.

FIG. 8 is a perspective view illustrating a semiconductor device 200 according to a second embodiment.

Figure 9:
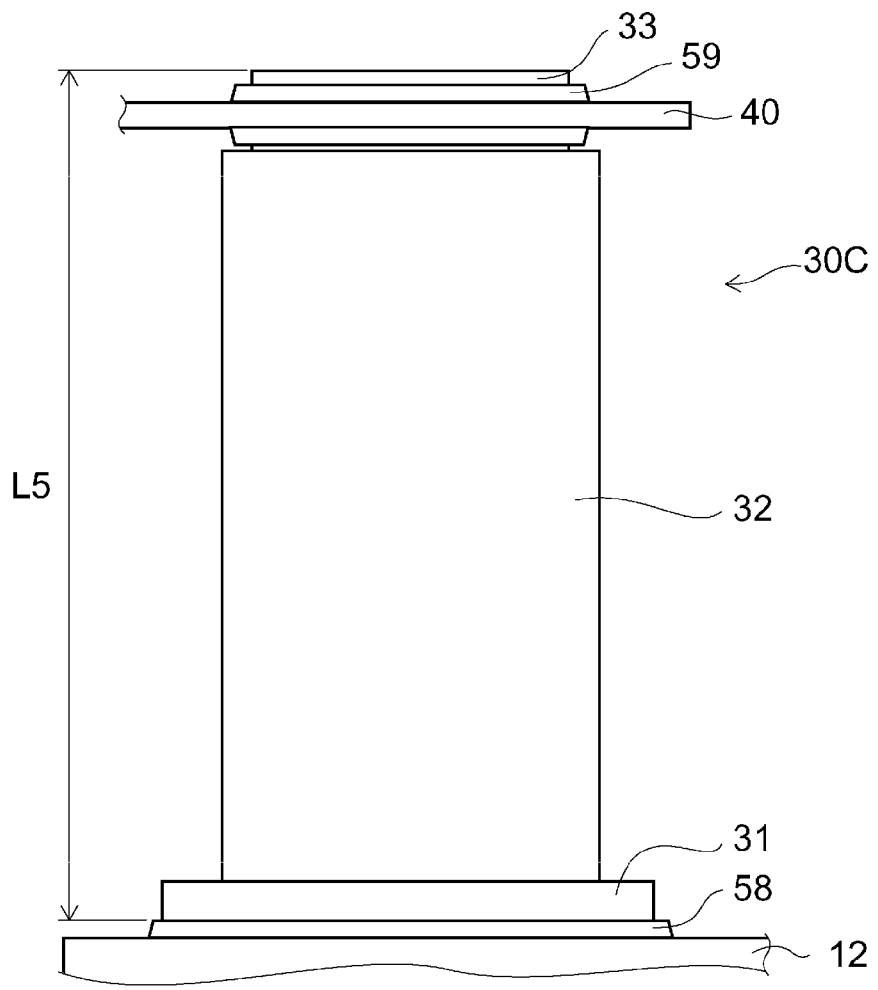
FIG. 9 is a side view illustrating a portion of a metal member and a metal plate included in the semiconductor device according to the second embodiment.

FIG. 9 is a side view illustrating a portion of the metal member 30C and the metal plate 40 included in the semiconductor device 200 according to the second embodiment.

In FIG. 8, the sealing portion 5, the collector terminal C, the emitter terminal E, the gate terminal G, and the wiring are omitted from the depiction for clarity.

As shown in FIGS. 8 and 9, in the semiconductor device 200 according to the second embodiment, a metal member 30C is provided on the second conductive layer 12 through the connector 58.

Similar to the metal members 30A and 30B, the metal member 30C includes the bottom portion 31, the main body portion 32, and the projection portion 33. The projection portion 33 is to be inserted into the hole (or recess) formed on the metal plate 40. The connector 59 is provided in a gap between the projection portion 33 and the metal plate 40 and the metal member 30C and the metal plate 40 are connected to each other through the connector 59.

According to the first embodiment, in the semiconductor device 100, the metal plate 40 is connected to the second conductive layer 12 through only the connector 58. By contrast, in the semiconductor device 200 according to the second embodiment, the metal plate 40 is connected to the second conductive layer 12 through the connector 58, the metal member 30C, and the connector 59.

A length L5 of the metal member 30C in the Z direction is typically longer than the length L1 of the metal member 30A and the length L2 of the metal member 30B since there is no chip disposed between the second conductive layer 12 and the metal plate 40.

More specifically, the length L5 of the metal member 30C is substantially identical to the combined length of the length L1 of the metal member 30A and the thickness of the semiconductor chip 21. The length L5 of the metal member 30C is also substantially identical to the combined length of the length L2 of the metal member 30B and the thickness of the semiconductor chip 22.

According to the second embodiment, the metal member 30C is provided on the second conductive layer 12 and the second conductive layer 12 and the metal plate 40 are connected to each other through the metal member 30C. Therefore, there is no need to fold and/or bend a portion of the metal plate 40, unlike in the semiconductor device 100 according to the first embodiment.

As compared to the first embodiment, the semiconductor device according to the present embodiment can be more easily manufactured. Accordingly, it is possible to improve production efficiency of the semiconductor device.

In the semiconductor devices according to the above-described embodiments, a case where the semiconductor chip 21 includes the IGBT and the semiconductor chip 22 includes the FRD is described. However, the semiconductor device according to the present disclosure is not limited thereto. For the semiconductor chips 21 and 22, a diode or a metal oxide semiconductor field effect transistor (MOSFET), an IGBT, or the like can be appropriately selected.

In addition, the semiconductor chips 21 and 22 may be the same type of semiconductor chip. Even when the semiconductor chips 21 and 22 are the same type of semiconductor chip, when the thickness of the semiconductor chip 21 is different from the thickness of the semiconductor chip 22, the difference in the thickness between the semiconductor chips can be offset by changing the length of the metal members 30A and 30B provided on each of the semiconductor chips 21 and 22.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. A person skilled in the art can appropriately select from well-known technology a specific configuration of each of components, such as the substrate 1, the substrate 2, the sealing portion 5, the first conductive layer 11, the second conductive layer 12, the third conductive layer 13, the fourth conductive layer 14, the semiconductor chip 21, the semiconductor chip 22, the metal member 30, the metal plate 40, the connectors 51 to 59, the collector terminal C, the emitter terminal E, the gate terminal G, and the like. The accompanying claims and their equivalents are intended to cover such forms or modifications as would fall within the scope and spirit of the inventions. In addition, each of the embodiments described above can be performed by combining with each other.

What is claimed is:

1. A semiconductor device, comprising:
a first conductive layer on a substrate;
a second conductive layer on the substrate and separated from the first conductive layer;
a first semiconductor chip mounted on the first conductive layer and having a first electrode on a side opposite the first conductive layer;
a second semiconductor chip mounted on the first conductive layer and having a second electrode on a side opposite the first conductive layer;
a first metal member mounted on the first electrode and extending away from the first semiconductor chip;
a second metal member mounted on the second electrode and extending away from the second semiconductor chip; and
a metal plate having a first portion disposed on the first and second metal members and a second portion connected to the second conductive layer, wherein
the metal plate electrically connects the first and second electrodes to the second conductive layer through the first and second metal members,
the first portion of the metal plate has a first hole and a second hole formed therein,
a portion of the first metal member extends through the first hole, and
a portion of the second metal member extends through the second hole.

2. The semiconductor device according to claim 1, further comprising:
a third metal member mounted on the second conductive layer, wherein
the second portion of the metal plate is connected to the second conductive layer by the third metal member.

3. The semiconductor device according to claim 2, wherein:

the second portion of the metal plate includes a third hole formed therein, and a portion of the third metal member extends through the third hole.

4. The semiconductor device according to claim 1, wherein the metal plate includes a bent portion between the first and second portions.

5. The semiconductor device according to claim 1, wherein:
the first semiconductor chip is a diode, and
the second semiconductor chip is a transistor.

6. The semiconductor device according to claim 1, wherein a total length of the first metal member in a direction away from the first semiconductor chip is different from a total length of the second metal member in a direction away from the second semiconductor chip.

7. A semiconductor device, comprising:
a substrate having a first surface;
a first conductive layer on the first surface;
a second conductive layer on the first surface;
a first semiconductor chip on the first conductive layer and having a first electrode and a second electrode, the first electrode being connected to the first conductive layer;
a second semiconductor chip on the first conductive layer and having a third electrode and a fourth electrode, the third electrode being connected to the first conductive layer, wherein the second semiconductor chip has a thickness along a first direction orthogonal to the first surface that is less than that of the first semiconductor chip;
a metal plate having a first portion above the first semiconductor chip and the second semiconductor chip in the first direction, and a second portion connected to the second conductive layer;
a first metal member between the first semiconductor chip and the first portion of the metal plate and connected to the second electrode and the metal plate; and
a second metal member between the second semiconductor chip and the first portion of the metal plate and connected to the fourth electrode and the metal plate,
wherein a length of the second metal member in the first direction is greater than a length of the first metal member in the first direction.

8. The semiconductor device according to claim 7, wherein:
the metal plate has a plurality of holes, and
an upper portion of the first metal member extends through one hole in the plurality and an upper portion of the second metal member extends through another hole in the plurality.

9. The semiconductor device according to claim 7, wherein:
a plurality of recesses are provided on a surface of the metal plate facing the first surface, and
an upper portion of the first metal member is disposed in one recess in the plurality and an upper portion of the second metal member is disposed in another recess in the plurality.

10. The semiconductor device according to claim 7, further comprising:

a third metal member between the second conductive layer and the second portion of the metal plate in the first direction.

11. The semiconductor device according to claim 7, wherein the metal plate includes a bent portion between the first and second portions.

12. The semiconductor device according to claim 7, wherein:
the first semiconductor chip is a diode, and
the second semiconductor chip is a transistor.

13. The semiconductor device according to claim 7, wherein the second portion of the metal plate is directly soldered to the second conductive layer.

14. A semiconductor device, comprising:
a first conductive layer on a substrate;
a second conductive layer on the substrate;
a first semiconductor chip on the first conductive layer having a first electrode and a second electrode, wherein the first electrode is connected to the first conductive layer;
a second semiconductor chip on the first conductive layer and having a third electrode, a fourth electrode, and a thickness that is less than that of the first semiconductor chip in a first direction, the third electrode being connected to the first conductive layer;
a metal plate connected to the first semiconductor chip, the second semiconductor chip, and the second conductive layer;
a first metal member electrically connecting the second electrode and the metal plate and soldered on the first semiconductor chip; and
a second metal member electrically connecting the fourth electrode and the metal plate and soldered on the second semiconductor chip, wherein
a length of the second metal member in the first direction is greater than a length of the first metal member in the first direction.

15. The semiconductor device according to claim 14, wherein:
the metal plate has a plurality of holes, and
an upper portion of the first metal member extends through one hole in the plurality and an upper portion of the second metal member extends through another hole in the plurality.

16. The semiconductor device according to claim 14, wherein:
a plurality of recesses are provided on a surface of the metal plate facing the substrate, and
an upper portion of the first metal member is disposed in one recess in the plurality and an upper portion of the second metal member is disposed in another recess in the plurality.

17. The semiconductor device according to claim 14, further comprising:
a third metal member between the second conductive layer and the metal plate in the first direction, electrically connecting the metal plate to the second conductive layer, and having a length in the first direction greater than the length of the first and second metal members.

* * * * *